Nov. 28, 1972 J. J. CUOMO ETAL 3,704,166
METHOD FOR IMPROVING ADHESION BETWEEN
CONDUCTIVE LAYERS AND DIELECTRICS
Filed June 30, 1969

INVENTORS
JEROME J. CUOMO
ASHOK F. MAYADAS
ROBERT ROSENBERG

BY Thomas J. Kilgannon Jr.
ATTORNEY 3,704,166
METHOD FOR IMPROVING ADHESION BETWEEN CONDUCTIVE LAYERS AND DIELECTRICS Jerome J. Cuomo, New York, Ashok F. Mayadas, Somers, and Robert Rosenberg, Peekskill, N.Y., assignors to International Business Machines Corporation, Armonk, N.Y.

Filed June 30, 1969, Ser. No. 837,779
Int. Cl. B44d *1/18*
U.S. Cl. 117—217 11 Claims

ABSTRACT OF THE DISCLOSURE

A method for improving adhesion between a conductive layer and a substrate of insulating material is taught which includes the steps of providing a substrate of insulating material such as silicon dioxide which contains a first cation and a first anion. A second cation such as aluminum is introduced into the substrate substitutionally by diffusion or ion bombardment. Finally, a layer of conductive material is deposited on the surface of the substrate by vacuum evaporation or sputtering. The conductive material includes a third cation such as tungsten which has an affinity for the first anion. The introduction of the second cation is carried out in only the surface layers of the substrate such that dielectric characteristics of the substrate are substantially unaffected. The invention basically teaches providing sites, in an insulating substrate, containing unbound atoms which are capable of chemically bonding with the deposited conductive material thereby obtaining improved adhesion at low temperature (e.g. at temperatures of 500° C. and below for W or Mo, whereas without the sites provided, poor adhesion would take place below 500° C.).

BACKGROUND OF THE INVENTION

Field of the invention

This invention relates generally to methods for improving the adhesion between conductive materials and insulating materials. More specifically, it relates to a method for improving the adhesion between a conductive layer and a substrate of insulating material at deposition temperatures of 500° C. and below. The conductive layer deposited on the surface of the substrate is chemically bonded to the substrate of insulating material by the method of the present invention at temperatures which are relatively low and at which adhesion between conductor and substrate was poor or nonexistent using prior art techniques.

Description of the prior art

Whenever the need for conductors carried by an insulating substrate arises as it often does in the integrated circuit art, the problem of obtaining good adhesion between the dielectric or insulating substrate and the metal chosen also appears. Because it is desired to control the depth of diffusions and the like in forming transistors in the integrated circuit environment, temperatures in subsequent processing steps such as the deposition of interconnections and the like are often limited to temperatures which will not affect the previously fabricated diffusions. Also, excessive heating of ohmic contacts such as PtSi causes degradation in the presence of a refractory metal being deposited. Because of these requirements, a limitation is automatically imposed on the metals which can be deposited at these low temperatures and still maintain good adhesion with the underlying dielectric or insulating substrate. As a result, conductive materials which have otherwise desirable characteristics in the integrated circuit environment are eliminated from contention because, using prior art techniques, reasonable adhesion to the underlying substrate can only be attained at rather high temperatures. For example, a major deterrent to the use of tungsten or molybdenum as an intermediate metallurgy to replace aluminum as a conductive interconnection in the integrated circuit environment has been the inability to deposit these metals at nominally low temperatures and obtain satisfactory adhesion with silicon dioxide underlayers. More often than not, where such desirable materials as tungsten and molybdenum cannot be used, some adherent transition metallurgy is utilized. For example, chromium which is highly adherent to silicon dioxide is often utilized as an intermediate transition metallurgy to insure against degradation of adhesion during operation. It should be appreciated at this point that adhesion between a conductor and an insulating or dielectric substrate is usually not a problem where there is no limitation on the temperatures which may be utilized during deposition of the conductive material. It should also be appreciated that there are certain conductor-dielectric systems which inherently provide good adhesion and require no intermediate metallurgy or treatment to improve the adhesion. An example of such a conductor-insulator system is aluminum or aluminum oxide. Thus, the prior art permits the integrated circuit designer to utilize systems which inherently have good adhesion, or permits the circuit designer to utilize conductive materials which can only be deposited at high temperatures or it permits the circuit designer to utilize systems in which an intermediate adherent transition metallurgy is required. All of the available choices impose limitations on both the fabrication techniques and the resulting structures and, as with most situations where there are only limited choices, a good deal of effort is being expended in just living with these choices. Any system, therefore, which would permit the avoidance of the prior art techniques and which would make available a wider choice of metallurgies which are capable of being deposited at low temperatures and still be strongly adherent to a dielectric or insulating substrate, would find immediate acceptance in the integrated circuitry art as well as in other arts where adhesion of metals to dielectric substrate at temperatures below 500° C. is important.

SUMMARY OF THE INVENTION

The method of the present invention in its broadest aspect comprises the step of introducing a material different from a nonconductive material substitutionally into a nonconductive or insulating substrate to provide sites therein containing unbound atoms which are capable of chemically bonding with a deposited conductive material on the surface of the substrate. A material having metallic characteristics and of different valence from the metal cation of the insulating substrate is substituted for the metal cation of the substrate. Because of the difference in valence, unbound anions become available which are capable of chemically interacting with the metal cation being deposited on the surface of the substrate.

In accordance with a more particular aspect of the invention, a substrate of insulating material such as silicon dioxide, silicon nitride or other insulating materal is provided. A metal cation such as aluminum or phosphorous is introduced into the substrate by diffusion or ion bombardment substitutionally. The second cation is introduced in such a way that it only affects the surface portions of the substrate and leaves the bulk portion of the substrate substantially unaffected as far as its dielectric properties are concerned. Finally, a layer of conductive material of a third cation is deposited by sputtering or vacuum evaporation onto the surface of the substrate where the conductive material, preferably a refractory metal such as tungsten or molybdenum, becomes chemically bonded to the substrate by providing an electron at the sites containing the unbound anions. The deposition of the refractory metal is carried out at temperatures of 500° C. and below and results in a highly adherent metallic coating on the surface of an insulating substrate which is not subject to peeling or otherwise separating from the substrate due to lack of adhesion.

It is, therefore, an object of this invention to provide a method of improving the adhesion between a metal and a dielectric.

Another object is to provide a method for improving the adhesion between a metal and a dielectric at temperatures of 500° C. and below.

Still another object is to provide a method of improving the adhesion between a metal and a dielectric in which the original metal cation of the dielectric is replaced with a metal cation which has greater affinity for the anion of the substrate than the original metal cation. In this way, a chemical bond is obtained without the necessity for adding an intermediate metallic layer.

The foregoing and other object, fetaures and advantages of the invention will be apparent from the following more particular description of a preferred embodiment of the invention as illustrated in the accompanying drawings.

DESCRIPTION OF THE PREFERRED EMBODIMENT

In accordance with preferred method steps as outlined in flow chart form in FIG. 1, a substrate with a highly adherent conductive layer on its surface is formed in the following way:

Step 1.—Providing a substrate of insulating material containing a first cation and a first anion.

Substrates useful in the practice of this invention are insulating materials having good dielectric properties and are generally oxides, nitrides, carbides, and like compounds of silicon and germanium. The most widely used of these insulating materials are silicon dioxide and silicon nitride. Since silicon dioxide and its behavior in the integrated circuit environment is the best known and most widely used dielectric material, this material will be utilized as an example in what follows.

Figure 2A:
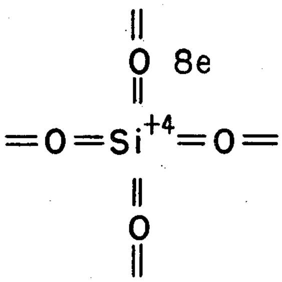
FIG. 2A is a schematic diagram of a silicon dioxide molecule as it normally appears with the silicon atom fully bound to its associated oxygen atoms in a tetrahedral configuration.

Silicon dioxide which can be formed on the surface of a silicon semiconductor wafer, for example, by well known techniques, contains a silicon cation having a plus 4 valence and 4 oxygen anions bound thereto in the arrangement as illustrated in FIG. 2A. In the arrangement shown in FIG. 2A, each silicon atom is bound to four oxygen atoms by two electron bonds. It should be obvious from FIG. 2A that in the arrangements shown, there are no available sites containing unbound or unsatisfied atoms. The bonding situation would be similar for the other anions such as nitrogen, carbon, phosphorous, sulphur, tellurium, and selenium.

The silicon substrate containing a surface layer of silicon dioxide is cleaned in any well known manner prior to the treating of the substrate in accordance with the teaching of the present application. Oxidized silicon substrates may be etched, for example, in a hot concentrated solution of $H_2SO_4$ and $K_2Cr_2O_7$, rinsed in distilled water and dried. The substrate is now ready for the second of the steps shown in FIG. 1.

Step 2.—Introducing into said substrate substitutionally a second cation different from said first cation by (a) solid state diffusion; (b) diffusion from the vapor phase; (c) ion bombardment.

Figure 2B:
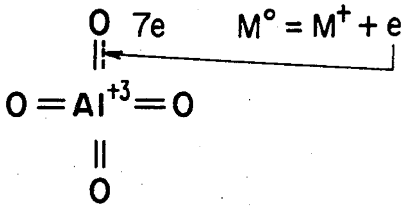
FIG. 2B is a schematic diagram of the molecule of FIG. 2A in which the silicon cation has been replaced with an aluminum cation of lower valence leaving an atom site, being satisfied by an available electron from a metal as a dotted line.

In this step, aluminum, for example, which has a lower valence (+3) than silicon (+4), is introduced into the surface layers of the substrate, substitutionally, where either metal ion vacancies are present or by displacement of the silicon atom. Under these circumstances, however, the bonding requirements of the oxygen atoms are unsatisfied and a site becomes available for formation of metal-oxygen bonds. The situation which obtains under circumstances where one metal of lower valence is substituted for a metal of higher valence is shown schematically in FIG. 2B. In FIG. 2B, the aluminum atom having a +3 valence is introduced substitutionally into what was the silicon-oxygen tetrahedron. Because of the valence differences, only three of the four available oxygen atoms have their bonding requirements satisfied and a vacant site shown as a dotted line between the aluminum atom and one of the oxygen atoms is made available for a subsequently formed metal-oxygen bond.

Figure 2C:
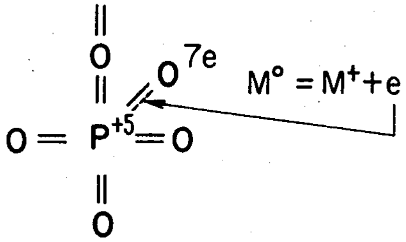
FIG. 2C is a schematic diagram of the molecule of FIG. 2A in which the silicon cation has been replaced by a phosphorous cation having a higher valence than the silicon and which attracts an excess oxygen atom. This figure also shows the available unbound oxygen atom site being satisfied by an available electron from a metal. The excess electron of the phosphorous atom may also attract positively charged metal atoms in the vapor stream impinging on the substate surface, thus improving adhesion.

Other materials having valences higher than the valence of silicon may be introduced to provide sites for subsequent metal-oxygen bonds. One such system which has a higher valence than silicon is a phosphorous-oxygen system. This arrangement is shown schematically in FIG. 2C wherein phosphorous having a valence of +5 has been introduced substitutionally into the silicon-oxygen tetrahedron. Under these circumstances, phosphorus is capable of satisfying the bonding requirements of the four associated oxygen atoms and in addition, it is capable of forming a single bond with another oxygen atom. When this occurs, the bonding requirement of this oxygen atom is unsatisfied and a site for a subsequently formed metal-oxygen bond as shown by the dotted line between the phosphorous and one of the oxygen atoms of FIG. 2C becomes available.

The second cation of valence higher or lower than the valence of the cation in the substrate may be introduced into the substrate by any one of a number of well known techniques. For example, where it is desired to replace the silicon cation with an aluminum cation in the silicon-oxygen tetrahedron, a few monolayers of aluminum (approximately 20 A.) is deposited by vacuum evaporation or by sputtering on the surface of the oxidized silicon wafer. Then, by solid state diffusion at a temperature of approximately (400° C.), the aluminum is diffused into the surface portion of the silicon dioxide layer. It is not necessary that this diffusion be carried out so that more than a few surface layers of the silicon dioxide are affected. To obtain the desired results in the practice of this invention, it is not necessary that unbound oxygen or other anion be present throughout the substrate thickness. It is only important that a high concentration of unbound oxygen or other suitable anion be present at the surface. This is of great significance in that the basic properties of the original dielectric substrate remain substantially unchanged. It should also be appreciated that the thickness dimension of the substrate remains substantially unchanged from what it was prior to the deposition of the monolayers of aluminum. This is a distinguishing characteristic of the method of the present invention when compared with prior art techniques. Prior art techniques such as the deposition of an intermediate metal require that the intermediate metal and the final metal to be deposited have an interface of pure metal between the two metals. In such a case, the criterion for good adhesion is that the intermediate metal have good adhesion characteristics between both the metal and the dielectric. Under these conditions, then, the metal to be deposited encounters a metal rather than a dielectric surface such as is encountered by the metal to be deposited in the present application and a finite thickness of metal, however small, must be available to obtain good adhesion under the prior art circumstances.

Other techniques for introducing the cation of higher or lower valence into the dielectric substrate, such as diffusion from the vapor phase or ion bombardment may be utilized with equal effect. By controlling the temperature in the case of the former and the accelerating potential in the case of the latter, the depth to which the second cation is introduced may be carefully controlled.

As has been indicated hereinabove, other materials such as iron, chromium, magnesium, tantalum, zirconium, boron, and beryllium may be utilized in the same way as aluminum and phosphorous and, because they provide unsatisfied or unbound oxygen when introduced substitutionally, they can, along with aluminum and phosphorous, be expected to form bonds with metals which have some degree of affinity for oxygen.

At this point, it should be appreciated that the teaching of the present invention is not limited to use with dielectrics of the metal oxide character alone. For example, the silicon cation forms excellent dielectrics with anions of nitrogen, carbon, phosphorous, sulphur, tellurium, and selenium. Excellent adhesion can be expected between these dielectrics and metals which are nitride, carbide, phosphide, sulphide, telluride, and selenide formers when second cations of higher or lower valence are introduced in place of silicon. From the foregoing, it should be clear that the teaching of the present application has wide utility and makes available metal-dielectric systems which heretofore would only provide good adhesion when the bonding was carried out at temperatures of 500° C. and up. The sole criterion to be adhered to with respect to the dielectric is that the second cation, when introduced by diffusion or other techniques, be capable of forming a compound with the anions already present and that sites be made available for forming a cation-anion bond with the metal to be deposited.

Figure 1:
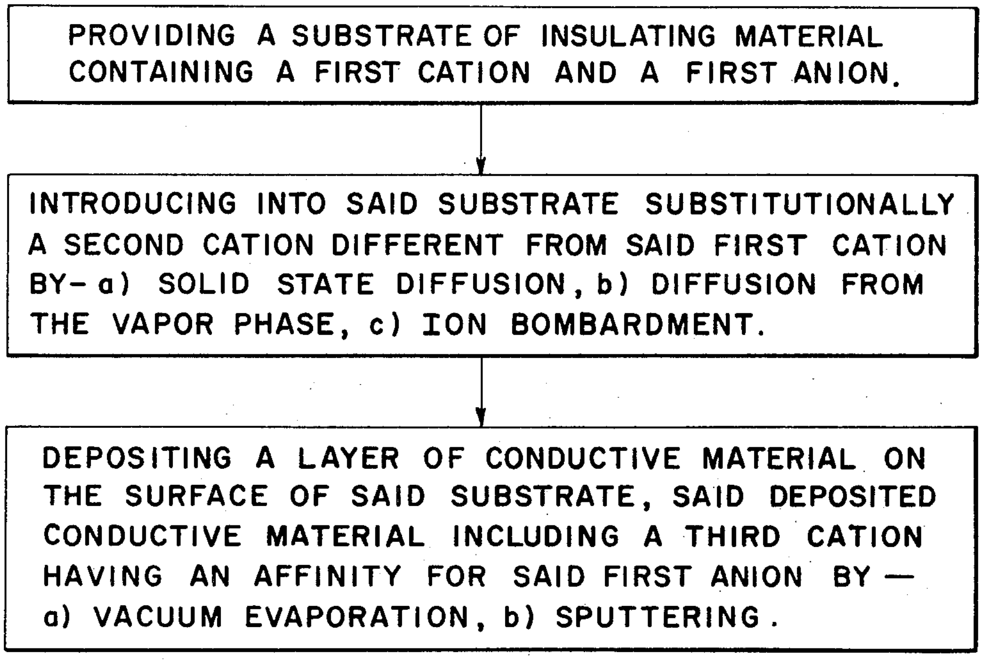
FIG. 1 is a flow chart diagrammatically outlining the principal method steps for improving the adhesion between a conductive material and a dielectric or insulating substrate.

Recalling now that a silicon dioxide layer on a silicon wafer has been formed and that a layer of aluminum has been deposited and diffused into the surface layers of the silicon dioxide, the last step in the process of the present application is carried out as shown in FIG. 1.

Step 3.—Depositing a layer of conductive material on the surface of said substrate, said deposited conductive material including a third cation having an affinity for said first anion by (a) vacuum evaporation, (b) sputtering, or (c) chemical vapor deposition.

Because of many desirable characteristics, refractory metals such as tungsten and molybdenum have long been recognized as potential candidates for interconnection metallurgy in the integrated circuit environment. As indicated hereinabove, however, their potential has not been realized because of the high temperatures required for their deposition. The deposition temperature of the refractory metals in the present application, is not in and of itself, unusual and is carried out at temperatures of 500° C. and below. What is unusual is the fact that at temperatures as low as 325° C., excellent adhesion was obtained whereas under the same circumstances except that the introduction of the second cation was not utilized, very poor adhesion was obtained on a comparable substrate.

The deposition of the third cation, tungsten, for example, may be deposited by the hydrogen reduction of tungsten hexafluoride at atmospheric pressure. Substrate temperatures range from 250° C. to 600° C. and the deposition rate is approximately 1,000 A. per second, and can be controlled from 300 to 6000 A. per second.

The deposition system is constructed entirely of stainless steel with the exception of a quartz mixing chamber and a quartz reaction tube. The tungsten hexafluoride was of high purity grade with special precautions taken in maintaining the specifications. A susceptor of spectrographically pure graphite coated with tungsten at high temperature to prevent outgassing during deposition was also utilized. More specific information and details on the above outlined system may be obtained from an IBM Research Report RC2404 entitled, "Electrical Resistivity of Tungsten Films Prepared by $WF_6$ Reduction" by A.F. Mayadas, J.J. Cuomo, and R. Rosenberg. Tungsten or any of the other refractory metals may be also deposited without departing from the spirit of the invention by sputtering techniques well known to those skilled in that art. Other suitable refractory metals include vanadium, niobium, tantalum, and molybdenum.

The main criterion to be adhered to with respect to the third cation is that it be capable of forming a chemical bond with the unsatisfied anions which resulted from the introduction of the second cation. Thus, tungsten is capable of forming tungsten oxide with the unbound oxygen ions of both FIGS. 2B and 2C. The metal tungsten, for example, upon deposition, provides an electron which satisfies the bonding requirements of the oxygen ions and the chemical bonding of the metal to the surface of the substrate. In the same manner, tungsten or any of the other refractory metals mentioned hereinabove, is capable of forming tungsten nitride or tungsten carbide. It should be clear, that depending upon which of the materials are utilized as the first, second, and third cations and the anion, that the conditions required for their formation or deposition will vary but, it should also be appreciated that the deposition of the third cation is carried out in all instances at temperatures of 500° C. and below and the resulting bond between the dielectric and the metal is highly adherent.

A number of comparisons were made to determine whether or not highly adherent substrates could be obtained using the technique of the present invention. In one instance, aluminum oxide ($Al_2O_3$) was deposited by sputtering on a silicon dioxide surface. Subsequent deposition of tungsten provided reasonably good adhesion down to about 350° C. as measured by well known "Scotch Tape" and etch tests. Tungsten deposited directly on silicon dioxide substrates under otherwise identical conditions, exhibited poor adhesion below 550° C. with actual spontaneous peeling below 500° C. Tungsten was also deposited onto vapor grown 30% alumino-silicate glass. The adhesion obtained appeared to be at least as good as that obtained for the sputtered $Al_2O_3$ substrate. In fact, tests using molybdenum show that adhesion to the alumino-silicate glass was superior to that on $Al_2O_3$, both being far superior to the adherence of tungsten on silicon dioxide.

Comparative adhesion tests were also carried out between tungsten and untreated silicon dioxide and aluminum treated silicon dioxide surfaces. A 50 A. layer of aluminum was deposited through a mask on to the center of an oxidized silicon wafer at a temperature of 400° C. and diffused at that temperature. X-ray topographs of the high temperature film (550° C.) and the substrate composite were obtained. The X-ray topographs showed a lack of adhesion in the unmasked central portion of the substrate indicating good adhesion while numerous areas of poor adhesion were observed in the peripheral region surrounding the treated central portion of the substrate.

Another test similar to the one described above was carried out at a temperature of 345° C. Strong adhesion contrast in the peripheral region indicated that the adhesion between the tungsten and the untreated $SiO_2$ film was very poor, whereas the absence of adhesion contrast in the central area of the sample indicated good film adhesion even at the low substrate temperature.

Based upon the foregoing, it should be clear that a method has been provided for improving the adhesion between dielectric films and metals which provides superior adhesion of refractory metals to dielectrics incorporating a silicon cation at temperatures of 500° C. and below.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A method for improving the adhesion between a conductive material and a dielectric material comprising the steps of:

providing a substrate having at least a dielectric surface portion made of at least one ionic pair of a cation and an anion the bonding requirements of said cation being fully satisfied by said anion, introducing into said surface portion substitutionally for said cation an element selected from the group consisting of aluminum, phosphorous, iron, chromium, magnesium, tantalum, zirconium, boron, and beryllium exhibiting a different valence from said cation to replace at least some of said cations the character of said surface portion remaining substantially dielectric, and depositing on said surface portion at a temperature of 500° C. and below a layer of conductive material consisting of a refractory metal having an affinity for said anion.

2. A method according to claim 1 wherein said cation of said ionic pair is silicon.

3. A method according to claim 1 wherein said cation of said ionic pair is germanium.

4. A method according to claim 1 wherein said refractory metal is one selected from the group of elements consisting of vanadium, niobium, tantalum, molybdenum and tungsten.

5. A method according to claim 1 wherein said anion of said ionic pair is an element selected from the group consisting of oxygen, nitrogen, and carbon phosphorous, sulfur, tellurium and selenium.

6. A method according to claim 1 wherein the step of introducing said element into said surface portion includes the steps of, forming a film of said element on the surface of said substrate, and heating said substrate to diffuse said element into said surface portion of said substrate.

7. A method according to claim 1 wherein the step of introducing said element into said surface portion includes the step of:

bombarding the surface of said substrate with ions of said element to cause said element to enter said surface portion.

8. A method according to claim 1 wherein said element is one having a valence higher than said cation of said ionic pair.

9. A method according to claim 1 wherein said element is one having a valence lower than said cation of said ionic pair.

10. A method for improving adhesion between a dielectric layer and a conductive layer comprising the steps of:

providing a substrate at least a surface portion of which is made of an insulating material selected from the group consisting of oxides, nitrides, carbides, phosphides, sulfides, tellurides, and selenides of silicon;

introducing a metal of a different valence from the valence of silicon substitutionally into said surface portion for said silicon to produce unbound atoms which are capable of chemically bonding with the material of said conductive layer, said metal being one selected from the group consisting of aluminum, phosphorous, iron, chromium, magnesium, tantalum, zirconium, boron, and beryllium the insulating character of said surface portion remaining substantially dielectric, and, depositing at temperatures of 500° C. and below a layer of conductive material on said surface portion, said material being selected from the group consisting of vanadium, niobium, tantalum, molybdenum, and tungsten.

11. A method according to claim 10 wherein the step of introducing includes the steps of, forming a film of said metal of different valence on the surface of said substrate, and heating said substrate to a temperature sufficient to cause diffusion of said film into only the surface of said substrate.

References Cited

UNITED STATES PATENTS

| | | | |
|---|---|---|---|
| 3,030,704 | 4/1962 | Hall | 29—589 X |
| 3,325,258 | 6/1967 | Fottler et al. | 117—217 X |
| 3,472,688 | 10/1969 | Hayashi et al. | 117—107 X |
| 3,492,546 | 1/1970 | Rosvold | 29—589 X |
| 3,492,719 | 2/1970 | Zeitman et al. | 29—589 |
| 3,325,702 | 6/1967 | Cunningham | 317—234 M |
| 3,442,012 | 5/1969 | Murray | 317—234 M |
| 3,442,721 | 5/1969 | McCaldin et al. | 317—235/48.9 |
| 3,463,976 | 8/1969 | Steinmetz, Jr., et al. | 317—234 M |
| 3,481,776 | 12/1969 | Manchester | 317—235/48.9 |

ALFRED L. LEAVITT, Primary Examiner

C. K. WEIFFENBACH, Assistant Examiner

U.S. Cl. X.R.

117—93.3, 227; 317—234 R, 234 J, 234 M